United States Patent [19]

Garcia et al.

[11] Patent Number: 4,502,127
[45] Date of Patent: Feb. 26, 1985

[54] TEST SYSTEM MEMORY ARCHITECTURE FOR PASSING PARAMETERS AND TESTING DYNAMIC COMPONENTS

[75] Inventors: R. F. Garcia, San Jose; Robert L. Hickling, Sunnyvale, both of Calif.

[73] Assignee: Fairchild Camera and Instrument Corporation, San Jose, Calif.

[21] Appl. No.: 378,937

[22] Filed: May 17, 1982

[51] Int. Cl.[3] .................... G06F 11/00; G06F 13/00; G01R 31/28
[52] U.S. Cl. ................................... 364/900; 371/25; 324/73 R; 364/481
[58] Field of Search ... 364/200 MS File, 900 MS File, 364/481, 489, 490; 324/73 R, 73 AT, 73 PC; 371/27, 20, 25

[56] References Cited

U.S. PATENT DOCUMENTS

| | | | |
|---|---|---|---|
| 3,927,371 | 12/1975 | Pomeranz et al. | 324/73 R |
| 4,070,565 | 1/1978 | Borrelli | 364/490 X |
| 4,204,633 | 5/1980 | Goel | 371/27 |
| 4,287,594 | 9/1981 | Shirasaka | 371/25 |
| 4,312,067 | 1/1982 | Shirasaka | 371/25 |
| 4,313,200 | 1/1982 | Nishiura | 371/25 |
| 4,335,457 | 6/1982 | Early | 371/28 |
| 4,365,334 | 12/1982 | Smith et al. | 371/27 |
| 4,385,275 | 5/1983 | Delvigne | 324/73 R |
| 4,404,519 | 9/1983 | Westcott | 324/73 R |
| 4,423,509 | 12/1983 | Feissel | 371/25 |

Primary Examiner—Raulfe B. Zache
Assistant Examiner—William G. Niessen
Attorney, Agent, or Firm—Theodore S. Park; Robert C. Colwell

[57] ABSTRACT

A test system memory architecture for passing parameters and testing dynamic components includes a main memory 15, a mask memory 20, and a definition memory 25, operating under control of a main sequence control memory 18. A corresponding subroutine memory 38, subroutine mask memory 22, and subroutine definition memory 27 operate under control of a subroutine sequence control memory 33. Multiplexing apparatus is used to selectively connect any of these memories to the formatter circuit 10. In addition, the architecture includes a parameter enabling memory 30 which is coupled to the subroutine SCM 33 and a switching means for controlling which of the subroutine memory 38 or main memory 15 is coupled to the formatter circuit 10.

13 Claims, 1 Drawing Figure

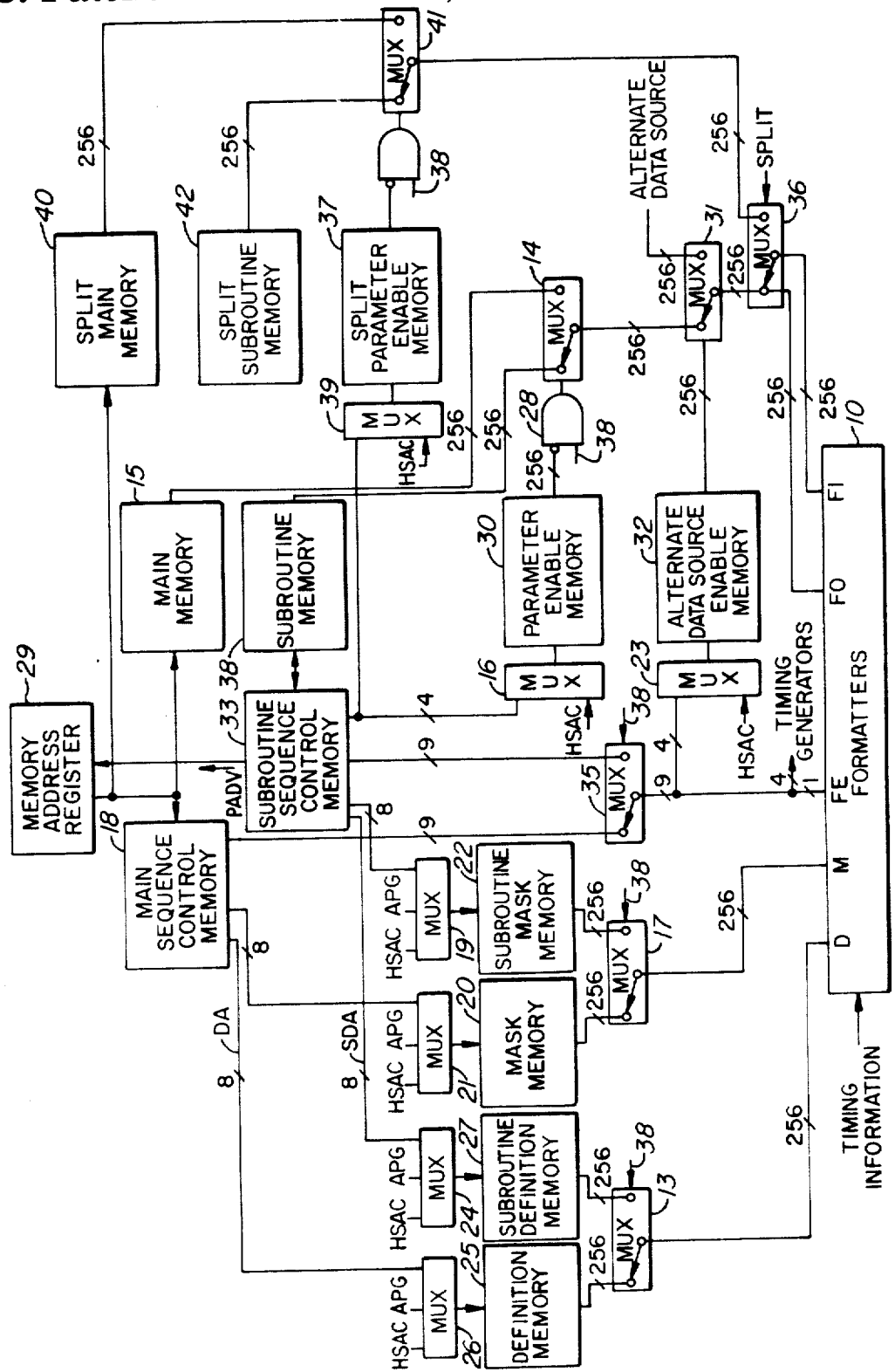

4,502,127

TEST SYSTEM MEMORY ARCHITECTURE FOR PASSING PARAMETERS AND TESTING DYNAMIC COMPONENTS

BACKGROUND OF THE INVENTION

1. Field of the Invention

This invention relates to automatic test equipment used for testing integrated circuits or other electronic devices, and, in particular, to a memory architecture for an automatic test system particularly suited for testing dynamic components or components in which the passing of parameters is necessary.

2. Description of the Prior Art

Many companies manufacture equipment suitable for testing integrated circuits or groups of integrated circuits. For example, the Test Systems Division of Fairchild Camera and Instrument Corporation, assignee of this invention, manufactures a broad line of such equipment, including systems known as Sentry ® systems. Typically, such systems include a group of memories necessary for storing information concerning the tests to be performed on a particular component, the necessary data for performing those tests, the desired output data, and other information, that is, the ones and zeroes for the drivers and comparators in the test apparatus, for functional testing of the device being tested.

Associated with the memories are another set of memories commonly known as sequence control memories. These memories provide control information by defining subroutine patterns, calling subroutines, invoking match modes, providing GO TO's, etc. In addition, the sequence control memories contain address bits for other support memories in the system, including the addresses for the main mask and definition memories. The mask memory is used to control the comparators of the pin electronics circuits, while the definition memory controls the drivers of the pin electronics circuits. Thus, a combination of the contents of the mask and definition memories, toegther with the truth table word from either the main memory or the subroutine memory, determine three bits of functional data per pin for the device under test.

Continuing advances in the complexity and capability of integrated circuits, however, have resulted in a need for a more flexible memory architecture. For example, in testing many dynamic components, several hundred thousand test cycles may be needed, and consequently more masks, definitions or vectors are required than the memories of the system are capable of storing. Typically, in some prior art automatic systems, this restriction has necessitated completely stopping testing of the component to enable reloading the necessary memories. Of course, after reloading the memories, a test sequence must be provided to bring the dynamic component to a known state before proceeding with further testing.

Another limitation in present test systems which has become increasingly undesirable with advancements in the state of microprocessor design is the difficulty to pass parameters from the main program to the subroutines. For example, in testing a typical microprocessor, the subroutine will contain the truth table which is constant for a particular microprocessor cycle, such as the instruction fetch operation, and it is desirable to pass to the formatter, in conjunction with the subroutine call, the location from which the fetch is to be performed. The use of such subroutines and parameter passing enables substantial compaction of data stored in the main memory when compared to the straight-line mode. The inability to pass such parameters therefore results in a need for larger memories, with the accompanying slower access times and increased cost.

SUMMARY OF THE INVENTION

This invention provides a memory architecture for a test system which contains independent main and subroutine memories and allows the passing of parameters between the main and subroutine memories and provides increased flexibility for the testing of dynamic components. In one embodiment, a test system memory architecture comprises formatting means for formatting a desired signal; main memory means for storing control, mask, definition, and data information; subroutine memory means for storing control and data information; switching means connected to receive signals from both the main memory means and the subroutine memory means; and parameter enabling means connected to receive control information from the subroutine memory means and connected to the switching means, the parameter enabling means for controlling which of the subroutine memory means and the main memory means is coupled to the formatting means. In another embodiment the subroutine memory means includes means for storing mask and definition information to enable looping by the subroutine while the main memory means and main mask and definition means are reloaded.

BRIEF DESCRIPTION OF THE DRAWING

The FIGURE is a block diagram of the preferred embodiment of the test system memory architecture of this invention.

DETAILED DESCRIPTION OF THE PREFERRED EMBODIMENT

This invention provides a test system memory architecture which enables testing dynamic components requiring large numbers of masks and definitions, and which allows the passing of parameters to subroutines in a manner enabling use of the test system in conjunction with the most advanced integrated circuits. A block diagram of the preferred embodiment of the memory architecture of this invention is shown in the FIGURE. The block diagram includes a number of memories, all selectively connectible to formatting circuits 10. The formatters 10 in turn, are connected to the pin electronic circuits associated with each pin of the test head to which the device under test is coupled. The well-known formatter circuits 10 format the necessary test signals for each pin of the device under test and supply them to the test head. The formatter circuits draw upon the information contained in the memories shown to create the necessary test signals for each of the pin electronic circuits.

The memories shown in the FIGURE include a main memory 15 which, in the preferred embodiment, is 64k words deep by the width of the tester, in groups of 16 pins up to 256 pins wide. A subroutine memory 38 allows loops in the truth table information stored in the main memory at maximum speed. Both the main memory 15 and the subroutine memory 38 contain the boolean data used for functional testing of the device coupled to the pin electronic circuits. Typically, each cycle of boolean data, known as a "vector," is a single word in the main or subroutine memory.

The memories shown also include a mask memory 20 and a definition memory 25. The mask memory 20 contains information for each cycle as to which pins of the device under test will have output data to be measured. The definition memory 25 contains information for each cycle concerning which pins of the device under test are to be driven with the particular boolean data from other memories. Thus, the mask memory 20 controls, through the formatting circuits 10, the comparators of the pin electronic circuits, while the definition memory 25 similarly controls the drivers of the pin electronic circuits. Each of the mask and definition memories is 256 words deep by the width of the tester in the preferred embodiment. Thus, in a manner which will be explained below, the main memory 15, mask memory 20 and definition memory 25 together determine the three bits of functional data necessary for each pin of the device being tested.

Associated with subroutine memory 38, and with the combination of memories 15, 20 and 25 is a sequence control memory (SCM). In the preferred embodiment the main sequence control memory 18 is 64k words deep by 64 bits wide, and the subroutine SCM memory 33 is 1k words deep by 64 bits wide. Each of the sequence control memories 18 and 33 provides addresses for information contained in other memories. For example, the main SCM memory 18 contains address information for each word in main memory 15 as to the address of the appropriate definition in definition memory 25 or mask in mask memory 20. Additionally, although not shown in the FIGURE, the SCM memory 18 includes information for the selection of the appropriate timing generators, necessary time delays, pulse widths, etc.

In contrast with prior art automatic test systems, the memory architecture shown also includes a subroutine definition memory 27 and a subroutine mask memory 22. In the preferred embodiment, each of these memories is 256 words deep by the width of the tester. These memories are for the exclusive use of the subroutine memory 38. While address information in the main D and M memories 25 and 20 is provided by the main SCM memory 18, address information for the subroutine definition memory 27 and subroutine mask memory 22 is provided by the subroutine SCM memory 33. In this manner, if vectors are being executed out of the main memory 15, the mask and definition data come from appropriate locations in the D and M memories 25 and 20 addressed by the SCM 18. Likewise, if vectors are being executed out of subroutine memory 38, the mask and definition data come from the SD and SM memories 27 and 22, respectively.

Multiplexers 13 and 17 determine whether main or subroutine mask and definition memory data reach the input terminal M and D of the formatter circuits 10. Multiplexers 13 and 17 are under control of the subroutine memory 38. In this manner, a dynamic component may be maintained in a continuous loop under control of the subroutine SCM memory 33, using data from memories 27 and 22, while the main mask 20 and definition memory 25, main memory 15 and main SCM 18 are reloaded with new test information. This avoids the disadvantage of prior art test systems in which it was often necessary to interrupt testing of a dynamic component to reload the main M and D memories 20 and 25, and then bring the device under test to a known condition.

To enable accessing of the mask and definition memories associated with both the main and subroutine memories by other subsystems in the automatic test equipment, multiplexers are connected to each memory. For example, multiplexer 21, associated with main mask memory 20, enables mask memory 20 to be loaded with high-speed access information via line HSAC, with algorithmic pattern generator information via line APG, or with information from the main SCM memory 18 via line MA. Similar multiplexers 26 and 24 are connected to the main definition memory 25 and the subroutine definition memory 27. A multiplexer 19 is connected to the subroutine mask memory 22 to perform the same function.

A unique feature of this invention is that it permits the passing of parameters to formatting circuits 10. This is made possible by the parameter enable memory (PEM) 30 which is as wide as there are channels in the tester. In the preferred embodiment PEM 30 is 16 words deep. The parameter enable memory 30 is addressed by four bits in the subroutine SCM memory 33. The subroutine SCM memory 33, via multiplexer 16, effectively determines on a per channel basis whether the bit for that channel for that cycle comes from the subroutine memory 38 (via multiplexers 14, 31 and 36) or from the main memory 15.

The PEM 30 functions in the following manner. When a vector is executed from subroutine memory, if the selected word from PEM 30 is all zeroes, then the one and zero data for the formatting circuits 10 comes wholly from the subroutine memory 38, and no parameter is passed on that cycle. When, however, a vector is executed from the subroutine SCM 33 and the selected word from the parameter enable memory 30 contains ones, then the one and zero data for the formatters 10 will come from subroutine memory 38 for those channels which have a zero in the corresponding PEM channel, and the one and zero data will originate from the main memory 15 for those channels which have a one in the corresponding PEM channel. In this manner, by addressing an appropriate word within the PEM memory 30, a particular vector in the subroutine may execute as is, without parameters, or one or more channels on that cycle may receive data from the main memory 15. The PEM functions by controlling gate 28, in conjunction with data from the subroutine memory, and gate 28 controls multiplexer 14.

To allow the subroutine SCM memory 33 to step to the next parameter in the call sequence from main memory in situations in which more than one parameter was passed, and to skip past the parameter word for purposes of returning from the subroutine back to the caller, a memory address register (MAR) 29 is provided. A bit from the subroutine SCM 33, referred to as the parameter advance bit (PADV), is transmitted from memory 33 to register 29.

The PADV increments the state of the memory address register 29 in the following manner. Typically, when a subroutine is called from the main memory, the memory address register 29 is pointing to a location incremented by 1 from the location from which the call for the subroutine was made. If no parameters are passed, this is the location to which the subroutine will return at its completion. If parameters are being passed, however, then the memory address register 29 will point to the location of the first parameter in the sequence. The PADV signal increments register 29 to point to the next parameter in the sequence. This same line may also be used to step past the last parameter, thereby enabling return to an appropriate location in main memory 15. Thus, the parameter advance bit may allow multiple return locations from a single subroutine. This enables information to be passed back to the main memory to indicate the results of execution by the subroutine.

Immediately below the parameter enable memory 30 in the FIGURE is depicted an alternate data source enable memory (ADSEM) 32. This memory controls multiplexer 31 to enable data from desired alternate data sources to be supplied through multiplexer 31 to formatters 10.

Also shown is a split main memory 40, a split subroutine memory 42, and a split parameter enable memory 37. Each of these is a duplicate of its counterpart previously explained. The purpose of these split memories is to enable expansion of the overall memory architecture for devices having very large numbers of pins. For example, in the preferred embodiment, the main, subroutine and PEM memories 15, 38, and 30, respectively, enable testing of devices having up to 256 pins. This capacity may be expanded by an additional 256 pins by adding the split units shown. Of course, the capacity could be further expanded by adding additional split units in the same manner or increasing the size of the main or split units.

The operation of the memory architecture shown in the FIGURE may be better understood in conjunction with testing of the typical microprocessor. Asseme that the microprocessor being tested has a typical read cycle in which the address bus of the microprocessor is in the high impedance state during a first cycle, then transfers to address valid during the second and third cycles. An address strobe line is used by the microprocessor to signify that the address bus has valid data during the third cycle. The device data bus will have valid data during at least the fourth cycle, when that data is strobed using a data strobe signal. The address strobe and data strobe, and typically many other corresponding signals, are coded into and stored in the subroutine memory 38. The particular addresses and data values are variable and are passed as arguments. The read cycle described may be coded into the memory as follows:

| Call Subroutine: | Last Vector in the Main Memory Before Going to Subroutine | |
|---|---|---|
| Parameter: | (Address) | (Data) |
| Subroutine: | | |
| Enable SD0. SM0. PEA0 | (All 1's) | (All 1's) |
| Enable SD1. SM1, and PEA1 | | (All 1's) |
| Enable SD2. SM2 and PEA2 | Address Strobe | |
| Enable SD3. SM3, PEA3, PADV, Return | (All 1's) | Data Strobe |

On the first subroutine cycle, location 0 of the subroutines D and M memories 27 and 22 and the parameter memories 30 are enabled. The combination of D equals 0 and M equals 0, with local memory equalling one, instructs the tester to check those pins for the high impedance state. PEA0 is the parameter enable memory address zero, and, in this example, that address would contain only zeroes to indicate that no parameters are used in that cycle.

In the next cycle, the subroutine D and M locations ffor address 1 contain the appropriate combination for the activites in the second cycle. The PEM 30 location 1 is selected. This location will have 1's on the tester channels to which the device address bus is connected and the address bits presented to the device will come from main memory 15. The data bus, however, is still in high impedance mode, so those channels are supplied data from the subroutine memory 38. On the next cycle, the contents of PEM location 2 are selected, and this word contains 1's for the data and address bus channels, thereby allowing the data and address field information to come from main memory, rather than subroutine memory 38.

The subroutine location now asserts the address strobe signal. Finally, on the fourth step, the appropriate combination of subroutine memories 27 and 22, with the parameter enable memory 30, satisfy the device cycle requirements. The PADV signal is incremented to step the memory address register 29 and execute a return of the subroutine cycle. In this manner, the read cycle for the microprocessor test, which normally requires four tester cycles, can be made into one subroutine and used repeatedly by calling it with the desired address and data information being passed along as argument. The formatters 10 then format and time this data before supplying it to the pin electronic circuits associated with each pin of the device under test.

Although a preferred embodiment of the invention has been described above, this embodiment is intended to illustrate the invention rather than limit it. The invention may be ascertained from the scope of the appended claims.

We claim:

1. A test system memory architecture comprising:
   main data storage means for storing test data;
   main mask storage means for storing first type information;
   main definition storage means for storing second type information;
   main control storage means connected to the main data storage means and to each of the main mask storage means and the main definition storage means for storing control information to control the main mask storage means and the main definition storage means;
   subroutine data storage means for storing test data;
   subroutine control storage means connected to the subroutine data storage means for storing control information;
   first switching means connected to the main data storage means, the subroutine data storage means, and a formatting means; and
   parameter enabling means connected to the subroutine control storage means and the first switching means for controlling the first switching means to enable selected data stored in the main data storage means and the subroutine data storage means to be supplied to the formatting means.

2. Apparatus as in claim 1 further comprising:
   subroutine mask storage means connected to the subroutine control storage means also for storing first type information;
   subroutine definition storage means connected to the subroutine control storage means also for storing second type information; and
   means for supplying the first type and the second type information to the formatting means.

3. Apparatus as in claim 2 further comprising definition switching means connected to the formatting means and to the main and subroutine definition storage means for controlling which is connected to the formatting means.

4. Apparatus as in claim 3 further comprising mask switching means connected to the formatting means and to the main and subroutine mask means for controlling which is connected to the formatting means.

5. Apparatus as in claim 4 wherein each of the mask and definition switching means are connected to and controlled by the subroutine control storage means.

6. Apparatus as in claim 2 wherein the means for supplying comprises:
    second switching means, responsive to the subroutine control storage means, and connected to the formatting means and to each of the main definition storage means and the subroutine definition storage means to selectively connect them to the formatting means; and
    third switching means, responsive to the subroutine control storage means, and connected to the formatting means and each of the main mask storage means and the subroutine mask storage means to selectively connect them to the formatting means.

7. Apparatus as in claim 6 further comprising:
    fourth switching means connected between the main control storage means and the main definition storage means;
    fifth switching means connected between the main control storage means and the main mask storage means;
    sixth switching means connected between the subroutine control storage means and the subroutine definition storage means;
    seventh switching means connected between the subroutine control storage means and the subroutine mask storage means;
    each of the fourth, fifth, sixth and seventh switching means being also connected to at least one additional data storage means to enable transfer of information from said additional data storage means to each of the main mask, main definition, subroutine mask, and subroutine definition storage means under control of the main control storage means and the subroutine control storage means.

8. Apparatus as in claim 7 further comprising:
    eighth switching means connected between the first switching means and the formatting means and connected to an alternate data source for enabling information from the alternate data source to be supplied to the formatting means in place of information from the main data storage means and the subroutine data storage means.

9. Apparatus as in claim 8 wherein the eighth switching means is connected to and controlled by alternate data source enabling means.

10. Apparatus as in claim 9 further comprising means for connecting the alternate data source enabling means to one of the subroutine control storage means and the main control storage means and the one to which it is connected controls the alternate data source enabling means.

11. Apparatus as in claim 10 further comprising a memory address register connected to the subroutine control storage means, the main control storage means, and the main data storage means for providing address information to the main data storage means and the main control storage means.

12. Apparatus as in claim 1 wherein the parameter enabling means comprises:
    parameter enabling storage means connected to the subroutine control storage means; and
    logic gate means having input terminals connected to the subroutine data storage means and to the parameter enabling storage means and having an output connected to the switching means.

13. Apparatus as in claim 1 wherein the first type information comprises mask information for controlling comparators and the second type information comprises definition information for controlling drivers.

* * * * *